United States Patent [19]

Kobayashi et al.

[11] 3,900,431

[45] Aug. 19, 1975

[54] PHOTOCONDUCTIVE MATERIAL COMPRISING A SOLID SOLUTION OF (Cd, Pb)S

[75] Inventors: Toshio Kobayashi, Kokubunji; Kenzo Susa, Hachioji; Satoshi Taniguchi, Tokorozawa, all of Japan

[73] Assignee: Hitachi, Ltd., Japan

[22] Filed: Apr. 8, 1974

[21] Appl. No.: 459,182

[30] Foreign Application Priority Data

Apr. 11, 1973 Japan ................................ 48-40445

[52] U.S. Cl. ................................ 252/501; 252/518

[51] Int. Cl.[2] ........................................ H01L 31/18

[58] Field of Search ............................ 252/501, 518

[56] References Cited

UNITED STATES PATENTS 3,486,059 12/1969 Kiuchi et al. .................. 252/501 X

*Primary Examiner*—Leland A. Sebastian

*Attorney, Agent, or Firm*—Craig & Antonelli

[57] ABSTRACT

A photoconductive material comprising a solid solution which has a general formula represented by (Cd, Pb)S and which has a rock-salt type crystal structure. The photoconductive material has its maximum sensitivity at wavelengths in an insensitive region lying between the high sensitivity regions of cadmium sulfide and lead sulfide which are known photoconductive materials. By suitably selecting the proportions of cadmium and lead, the high sensitivity region of the photoconductive material can be set at any desired wavelength between the high sensitivity region of cadmium sulfide and that of lead sulfide.

13 Claims, 3 Drawing Figures

PHOTOCONDUCTIVE MATERIAL COMPRISING A SOLID SOLUTION OF (Cd, Pb)S

BACKGROUND OF THE INVENTION

1. Field of the Invention:

The present invention relates to a semiconductor photoconductive material employing metallic sulfides.

2. Brief Description of the Prior Art:

As semiconductor photoconductive materials, there have heretofore been used cadmium sulfide having the wurtzite type crystal structure and lead sulfide having the rock-salt type crystal structure. Photoconductive cells employing these materials are in the maximum sensitivity wavelength of approximately 500 m$\mu$ and 2,000 m$\mu$, respectively, and are high performance cells in the vicinities of the respective maximum sensitivity wavelengths. With these photoconductive cells, however, an insensitive region of low sensitivity exists between their high sensitivity regions. A novel photoconductive cell operating at high performance in the insensitive region has been required. Up to the present time, a semiconductor photoconductive cell of high performance as covers the insensitive region is not yet fabricated.

SUMMARY OF THE INVENTION:

An object of the present invention is to eliminate the above-stated disadvantage of the prior art, and to provide a material which can be used for a semiconductor photoconductive cell with a wavelength characteristic having a high sensitivity region at any desired wavelength in the insensitive region between the maximum sensitivity wavelength of the cadmium sulfide photoconductive cell and that of the lead sulfide photoconductive cell.

The present invention has accomplished this object by employing as the photoconductive material a metallic sulfide solid solution which has the rock-salt type crystal structure and which is represented by the general formula of (Cd, Pb) S.

Under normal pressure, cadmium sulfide has the wurtzite type crystal structure, while lead sulfide has the rock-salt type crystal structure. With conventional methods, therefore, it is impossible to prepare a solid solution of these substances. In contrast, under a high pressure, both the sulfides have the rock-salt type crystal structure, and a solid solution can therefore be synthesized. Even when the pressure is reduced to normal pressure, i.e. atmospheric, a solid solution having the rock-salt type crystal structure can exist stably. Taking note of this fact, the inventors fabricated a photoconductive cell employing a metallic sulfide solid solution which has the rock-salt type crystal structure and which is represented by the general formula of (Cd, Pb) S, and measured the wavelength characteristic of photocurrents. As the result, it has been revealed that the photoconductive cell has effective photoconductivity in the insensitive region of the wurtzite type of cadmium sulfide photoconductive cell and the rock-salt type of lead sulfide photoconductive cell, namely, in the wavelength region of from 600 to 2,000 m$\mu$. The present invention has been made on the basis of this new finding.

Further, the inventors fabricated photoconductive cells of the rock-salt type of metallic sulfide solid solution with different proportions of cadmium and lead, and measured the wavelength characteristics. As the result, it has been revealed that the wavelength characteristics vary continuously with the proportions of cadmium and lead. That is, in accordance with this invention, it has become possible to fabricate a photoconductive cell having any desired wavelength characteristic within the wavelength region by suitably selecting the proportion of cadmium and lead.

FIG. 3 of the accompanying drawing referred to in the description of the embodiments of this invention is a graph showing the relationship between the chemical compositions and maximum sensitivity wavelengths of the photoconductive material according to the present invention. Using the graph, the chemical composition of the material with its maximum sensitivity wavelength at any desired wavelength can be selected. For example, where the desired maximum sensitivity wavelengths are approximately 750 m$\mu$, approximately 780 m$\mu$, approximately 930 m$\mu$ and approximately 1,300 m$\mu$, metallic sulfide solid solutions in which the values $x$ of the chemical formula of $Cd_{1-x}Pb_xS$ are 0.1, 0.2, 0.5 and 0.8, respectively, may be used as the photoconductive materials.

The photoconductive material according to the present invention is especially effective in a composition range in which the above-mentioned value $x$ is about 0.1 to about 0.98. With compositions in which the value $x$ is smaller than 0.1, there arises the tendency that the rock-salt type crystal structure becomes unstable. On the other side, when the value $x$ is larger than 0.98, the maximum sensitivity wavelength becomes close to that of the known material PbS as apparent from FIG. 3. However, even when the value $x$ lies outside the specified range, some effect can be expected as long as the photoconductive material is the solid solution consisting of CdS and PbS.

BRIEF DESCRIPTION OF THE DRAWING:

The invention will be further understood from the following detailed description and the accompanying drawing wherein.

DESCRIPTION OF THE PRESENTLY PREFERRED EMBODIMENTS:

Hereunder the present invention will be described in connection with certain embodiments.

Embodiment 1

Figure 1:
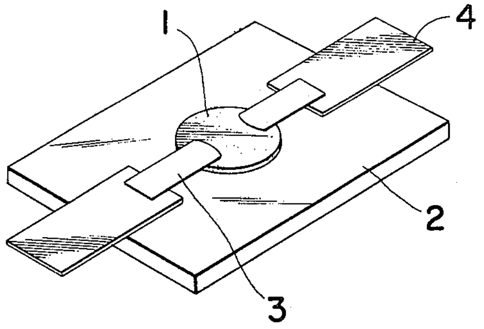
FIG. 1 is a schematic view showing a photoconductive cell which was used in an embodiment of the present invention.
Figure 2:
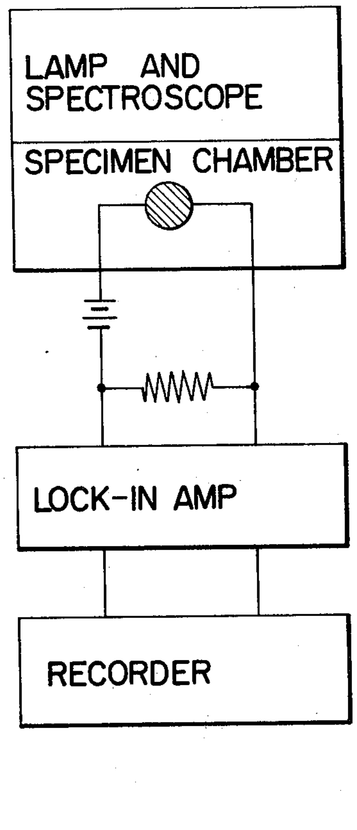
FIG. 2 is a block diagram of a system which was employed for the characteristic measurements of the photoconductive cell used in the embodiment.

Powdery cadmium sulfide and lead sulfide were weighed so as to obtain a composition in which $x$ was 0.1 in the chemical formula of $Cd_{1-x}Pb_xS$. The sulfides were mixed well, and the mixture was filled into a platinum capsule. The capsule was covered with boron nitride, and was charged into pyrophillite as a pressure medium that included a carbon heater therein. Using a piston-cylinder type superhigh pressure and temperature generator, the pyrophillite was held under conditions of 20 Kbar and 800°C. for about 4 hours. Thereafter, the temperature was first lowered to room temperature, and the pressure was subsequently reduced to 1 atmosphere. Thus, a sintered compact of a stable rock-salt type of metallic sulfide solid solution $Cd_{0.9}Pb_{0.1}S$ was obtained. At the next stage, the sintered compact was worked into discs 0.3 mm. in thickness and 20 mm.$^2$ in area by slicing and polishing. After each specimen had one side finished into a mirror surface, it was bonded to a glass substrate. It was formed with electrodes by evaporation of indium, and was provided with leads of copper sheets. Thus, a photoconductive cell as shown in FIG. 1 was fabricated. In FIG. 1, reference numeral 1 designates the specimen of the metallic sulfide solid solution having the rock-salt type crystal structure, reference numeral 2 the glass substrate, reference numeral 3 the electrode of the evaporated indium film, and reference numeral 4 the copper sheet lead. The photoconductive cell of $Cd_{0.9}Pb_{0.1}S$ as fabricated by the foregoing method was installed in a specimen chamber shown in the block diagram of FIG. 2. A DC voltage of 900 volts was applied to the photoconductive cell. After photospectroanalysis of the light of a tungsten lamp, the photoconductive cell was irradiated by the light.

A photocurrent at this time was converted into a voltage by a resistor. The voltage was amplified by a lock-in amplifier, and then recorded by a recorder. As the light was scanned over wavelengths of from 350 mμ to 2,500 mμ, the photocurrent changes of the photoconductive cell were measured. Subsequently, the wavelength dependency of the light of the tungsten lamp was corrected, and the wavelength characteristic of the $Cd_{0.9}Pb_{0.1}S$ photoconductive cell was evaluated.

As the result, the $Cd_{0.9}Pb_{0.1}S$ photoconductive cell had its maximum sensitivity wavelength at 780 mμ, and exhibited photoconductivity of high sensitivities between 450 mμ and 1,050 mμ.

Embodiments 2 – 13

Similar experiments were carried out by changing the value $x$, the temperature condition and the pressure condition used in Embodiment 1. Photoconductive cells of the rock-salt type $Cd_{1-x}Pb_xS$ solid solution were fabricated. The wavelength characteristics of the photoconductive cells were evaluated with different applied voltages by the same measuring method. Table 1 gives the experimental conditions in these embodiments and Embodiment 1 and the maximum sensitivity wavelengths and high sensitivity regions of the photoconductive cells.

Reference Example 1

A similar experiment was performed in such way that only the powdery cadmium sulfide in Embodiment 1 was used as a raw material. The results are included in Table 1.

Reference Example 2

A photoconductive cell was fabricated in such way that a CdS single crystal having the wurtzite type crystal structure was subjected to the same working conditions as in Embodiment 1. The wavelength characteristic of the CdS photoconductive cell was evaluated by the same measuring method. The results are also given in Table 1.

Reference Example 3

A PbS photoconductive cell commercially available had its wavelength characteristic measured by the same measuring method as in Embodiment 1. The results are also given in Table 1.

TABLE 1

Measured Results of Photoconductivity of Rock-Salt Type $Cd_{1-x}Pb_xS$ Solid Solution

| Embodiment | Composition x | Pressure at Synthesis (Kbar) | Temperature at Synthesis (°C) | Synthesized Phase | Applied Voltage (V) | Maximum Sensitivity Wavelength (mμ) | High Sensitivity Region (mμ) |
|---|---|---|---|---|---|---|---|
| 1 | 0.1 | 20 | 800 | rock-salt type | 900 | 780 | 450 – 1,050 |
| 2 | 0.1 | 20 | 800 | ″ | 1,350 | 750 | 500 – 1,000 |
| 3 | 0.1 | 20 | 800 | ″ | 810 | 730 | 400 – 950 |
| 4 | 0.1 | 20 | 700 | ″ | 900 | 760 | 450 – 950 |
| 5 | 0.2 | 20 | 800 | ″ | 450 | 800 | 400 – 900 |
| 6 | 0.2 | 20 | 800 | ″ | 270 | 760 | 500 – 1,050 |
| 7 | 0.2 | 20 | 700 | ″ | 450 | 780 | 450 – 950 |
| 8 | 0.2 | 10 | 700 | ″ | 270 | 790 | 450 – 1,050 |
| 9 | 0.5 | 20 | 800 | ″ | 180 | 920 | 500 – 1,150 |
| 10 | 0.5 | 20 | 700 | ″ | 270 | 930 | 600 – 1,150 |
| 11 | 0.5 | 10 | 700 | ″ | 180 | 950 | 550 – 1,200 |
| 12 | 0.8 | 10 | 800 | ″ | 90 | 1,300 | 800 – 1,550 |
| 13 | 0.8 | 10 | 700 | ″ | 30 | 1,330 | 830 – 1,600 |
| Ref. Example 1 | 0 | 10 | 700 | wurtzite type | 810 | 530 | 480 – 640 |
| Ref. Example 2 | CdS | Single Crystal Photoconductive Cell | | ″ | 90 | 520 | 480 – 560 |
| Ref. Example 3 | PbS | Photoconductive Cell commercially available | | rock-salt type | 30 | 2,100 | 1,200 – 2,400 |

As set forth above, according to the present invention, when the metallic sulfide solid solution having the rock-salt type crystal structure and represented by the general formula of (Cd, Pb) S is used, a photoconductive cell which has its high sensitivity region in the insensitive region of from 600 to 2,000 mμ can be fabricated, and the photoconductive cell which has any desired wavelength characteristic can be fabricated by suitably selecting the proportions of cadmium and lead.

Figure 3:
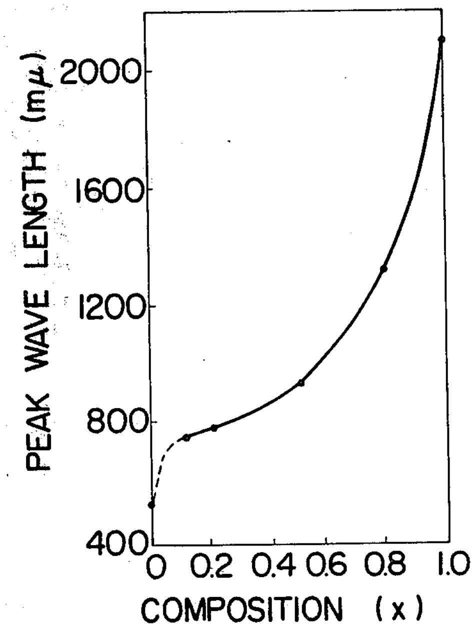
FIG. 3 is a graph showing the relationship between the chemical compositions and maximum sensitivity wavelengths of a photoconductive material according to the present invention.

FIG. 3 is a graph which shows the relationship between the chemical compositions and maximum sensitivity wavelengths (indicated by average values of specimens of the same compositions, respectively) of the embodiments and reference examples. In the graph, the axis of abscissas represents the values of $x$, and the axis of ordinates the maximum sensitivity wavelengths (in $m\mu$).

In the performance of the present invention, the use of the above-stated devices is not always necessary, but any devices which can fabricate a desired specimen or which can measure photocurrent changes can be adopted. The shape of photoconductive cell is subject to no restriction.

Further, the photoconductive material according to the present invention can be employed not only for the photoconductive cell exemplified in the embodiments, but also for all devices exploiting photoconductivity, for example, an image sensing device.

It will be understood from the data in Table I that the photoconductive material of this invention can be produced under a variety of conditions, generally, the pyrophillate containing the platinum with the mixture of sulfides is maintained under conditions of 20 – 30 K bar and 600° – 800°C, for 2 – 5 hours.

While the novel embodiments of the invention have been described, it will be understood that various omissions, modifications and changes in these embodiments may be made by one skilled in the art without departing from the spirit and scope of the invention.

What is claimed is:

1. A photoconductive material comprising a solid solution represented by the general formula (Cd, Pb)S and which has a rock-salt type crystal structure.

2. A photoconductive material comprising a solid solution represented by the general formula $Cd_{1-x}Pb_xS$, the value $x$ being at least 0.1 and at most 0.98, and which has a rock-salt type crystal structure.

3. The photoconductive material of claim 2, wherein $x$ is about 0.1.

4. The photoconductive material of claim 2, wherein $x$ is about 0.2.

5. The photoconductive material of claim 2, wherein $x$ is about 0.5.

6. The photoconductive material of claim 2, wherein $x$ is about 0.8.

7. A process for making a photoconductive material composed of a solid solution represented by the general formula (Cd,Pb)S and which has a rock-salt type crystal structure, said process comprising maintaining the temperature of a mixture of powdery cadmium sulfide and powdery lead sulfide at at least about 600°C for a period of time and under a pressure sufficient so that the calcium sulfide and lead sulfide form a solid solution having a rock-salt type crystal structure.

8. The process of claim 7, wherein the temperature of said mixture is maintained at at least about 600°C for at least about two hours and under a pressure of at least about 20 K bars.

9. The process of claim 8, wherein said mixture is maintained under a pressure of about 20 to 30 K bars at a temperature of about 600° to 800°C for about 2 – 5 hours.

10. The process of claim 9 further comprising lowering the temperature of said mixture to room temperature after a solid solution having a rock-salt crystal structure is formed.

11. The photoconductive material of claim 2, wherein said photoconductive material consists essentially of said solid solution.

12. The photoconductive material of claim 11, wherein said photoconductive material consists of said solid solution.

13. The photoconductive material of claim 1, wherein the temperature of said solid solution is about room temperature.

* * * * *